United States Patent [19]

Vigarié et al.

[11] Patent Number: 4,841,462

[45] Date of Patent: Jun. 20, 1989

[54] RANDOM ACCESS MEMORY AND LINEAR INTERPOLATION CIRCUIT COMPRISING APPLICATION THEREOF

[75] Inventors: Jean-Pierre Vigarié, Cesson Sevigne; Jean-Claude Carlach; Pierre Penard, both of Rennes, all of France

[73] Assignees: Etat Francais, Administration des P.T.T. (Centre National d'Etudes des Telecommunications), Issy les Moulineaux; Etabilissement Public dit "Telediffusion de France", Montrouge, both of France

[21] Appl. No.: 800,413

[22] Filed: Nov. 21, 1985

[30] Foreign Application Priority Data

Nov. 21, 1984 [FR] France ............................ 84 17738

[51] Int. Cl.[4] ..................... G06F 7/38; G11C 7/00; H01L 27/02
[52] U.S. Cl. ............................. 364/723; 365/190; 357/40
[58] Field of Search ............ 364/723, 700; 365/190, 365/205, 220; 357/40-42

[56] References Cited

U.S. PATENT DOCUMENTS

| 4,282,578 | 8/1981 | Payne et al. | 364/723 |
| 4,435,793 | 3/1984 | Ochii | 365/190 |
| 4,511,989 | 4/1985 | Sakamoto | 364/723 |
| 4,535,426 | 8/1985 | Ariizumi et al. | 357/41 |
| 4,602,545 | 7/1986 | Starkey | 364/723 |
| 4,635,229 | 1/1987 | Okumura et al. | 365/190 |
| 4,653,025 | 3/1987 | Minato et al. | 357/42 |

Primary Examiner—Gary V. Harkcom
Assistant Examiner—Long Thanh Nguyen
Attorney, Agent, or Firm—Larson and Taylor

[57] ABSTRACT

A random access memory (RAM) comprises memory cells each including an RS type flip-flop having complementary data inputs and transistors for forcing the flip-flop by that one of two data wires which is at a given level (high level for example) when a selection wire is at a first given level (high level for example). The flip-flop is connected to an output wire by circuitry for maintaining the output wire at the high level as long as the selection wire is at the first level and for causing the output wire to take the level corresponding to the condition of the flip-flop when the selection wire is brought to the other level. The transistors are preferably N-MOS for higher speed.

8 Claims, 4 Drawing Sheets 4,841,462

1

RANDOM ACCESS MEMORY AND LINEAR INTERPOLATION CIRCUIT COMPRISING APPLICATION THEREOF

FIELD OF THE INVENTION

The invention relates to fast read-out random access memories (RAMs) adapted for integration on a semiconductor substrate, typically silicon, as MOS transistors. It is particularly suitable for use in the field of digital linear interpolators for carrying out various processes, such as sound synthesis and digital generation of periodic signals.

SUMMARY OF THE INVENTION

A first object of the invention is to provide a RAM in which each memory or storage point has a construction allowing read-out in a very short time (while it is accepted that a writing cycle may be appreciably longer) and which does not require a reading amplifier whose passage time would lengthen the cycle duration. Another object of the invention is to provide a RAM so arranged that two values stored in successive addresses in the memory may be obtained simultaneously and in response to a single addressing operation, for example, two values between which it is desired to effect a linear interpolation.

It is still a further object of the invention to provide an interpolation circuit which makes the result of the interpolation calculation available in a time which does not substantially exceed that of the read-out in a memory in which is stored a catalog of the data between which the interpolation is to be effected.

With the above objects in mind, there is provided a RAM having a plurality of memory points or cells. Each storage point has a RS flip-flop having two MOS storage transistors, whose drains are grounded and whose sources are connected to a voltage source through respective load transistors, a MOS output transistor whose grid is connected to the source of one of said storage transistors and whose source is connected to a read-out output line, two input data lines arranged to receive complementary binary data each connected to the grid of a respective one of a pair of MOS switch transistors whose source is connected to the source of a respective one of said storage transistors, a pair of first control transistors each having a grounded drain and a source which is connected to the drain of a respective one of said switch transistors and a second control transistor having a grounded drain and a source which is connected to the drain of the output transistor, and a selection line connected to the grids of all said control transistors. Consequently the read-out line remains at a logic high level as long as said selection line is at a first logical level and said read-out output line takes a level corresponding to the condition of said RS flip-flop when the selection line is brought to the other logic level.

The above defined construction reduces the read-out time, particularly when N-MOS technology is used which, at the present time, is the one which provides the highest speed.

The RAM will typically comprise a plurality of lines or rows each corresponding to a binary word or byte including several memory points having the same selection wire. In the application of this memory arrangement to the construction of a linear interpolator according to another object of the invention, read-out may be achieved with a single address consisting of a real word, having a whole part and a fractional part. The fractional part will be used for generating an intermediate value by interpolation. On the other hand, access for writing in the memory may remain similar to the access to a conventional memory and be achieved with an address formed by the whole part of the read-out address.

When used in an interpolation circuit, the RAM is advantageously split into two blocks, one corresponding to the even addresses, the other to the uneven addresses. The RAM is associated to (i) decoding means which, in response to a real single address (k, x), causes read-out of the data written at addresses k and k+1 (k being the whole part of the address) and (ii) to an operator which performs the function:

$$y(k)*x + y(k+1)*(1-x) \qquad (1)$$

The invention will be better understood from the following description of a particular embodiment given by way of example.

SHORT DESCRIPTION OF THE DRAWINGS

DETAILED DESCRIPTION OF AN EMBODIMENT

A particular embodiment of a RAM memory point according to the invention will be described first, providing a read-out time of 20 ns and suitable for implementation in a LSI on silicon.

Figure 1:
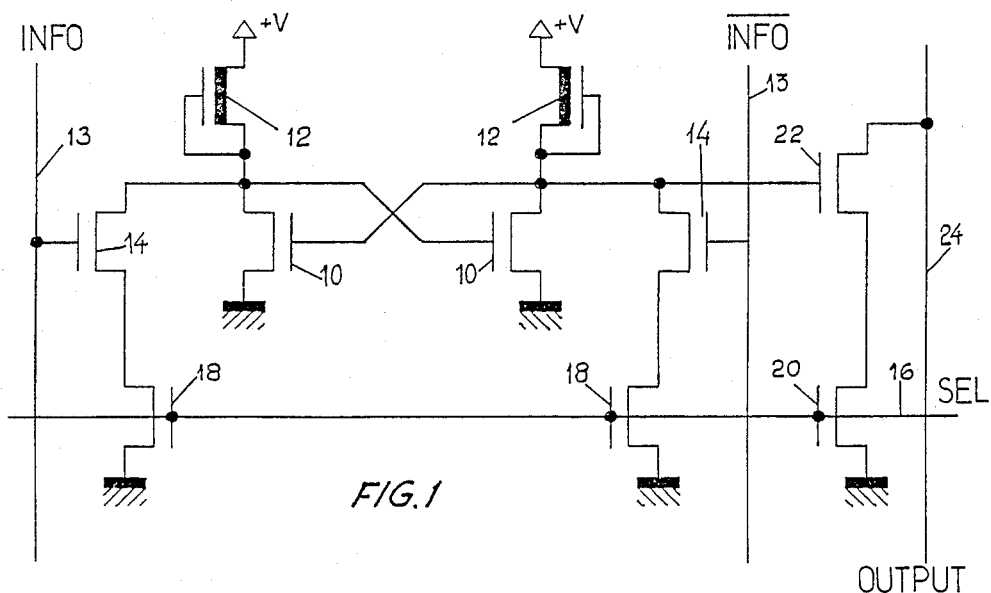
FIG. 1 is an electric diagram of a memory point according to a particular embodiment of the invention.

Referring to FIG. 1, a memory point is illustrated which may be made in N-MOS technology. It comprises an RS type flip-flop having two transistors 10 mounted conventionally as a bistable, whose drains are grounded, whose sources are connected to a +V electric supply by complementary transistors 12 and whose gates are connected to the input data wires 13, identified as INFO and $\overline{\text{INFO}}$, through transistors 14.

A selection wire 16, referenced SEL in the Figures, is connected to the gate of three transistors 18 and 20 whose drains are grounded. The source of each of the transistors 18 is connected to the drain of a corresponding transistor 14. The source of transistor 20 is connected to the drain of an output transistor 22 whose source is connected to the output wire 24 and whose gate is connected to the drain of that one of the transistors 10 which receives the data signal $\overline{\text{INFO}}$.

In this circuit, the RS flip-flop of the memory point is forced by that one of the two data wires 13 which is at logic "high" level when the selection wire 16 is at the high level. The memory point will therefore be in writing mode when the selection wire 16 is at the high level and when a binary data is applied to the input, which implies that one of the wires 13 is at the high level.

After writing in, i.e. after the flip-flop has been forced into a predetermined state, the output wire 24 remains preloaded at the high level, irrespective of changes in the condition of the flip-flop, as long as the selection wire is at the high level and even if the wires 13 have both come back to the low level. This is a mode which may be termed storage or preloading.

The memory point or cell passes to the read-out mode when the selection wire 16 is brought to the "low" level. The output wire 24 then remains at the high level if the bit value stored in the flip-flop corresponds to the low level. It passes to the low level if the bit value stored corresponds to a "high" level.

In N-MOS technology, this preloading and interrogation mode allows fast read-out.

Data read-out is effected in a single cycle and in a minimum of time, due to preloading of the memory cell (which is in itself known but provides particular advantages within the circuit of the invention) and due to the absence of a separate reading amplifier, whose transit time would lengthen the cycle duration.

Figure 2:
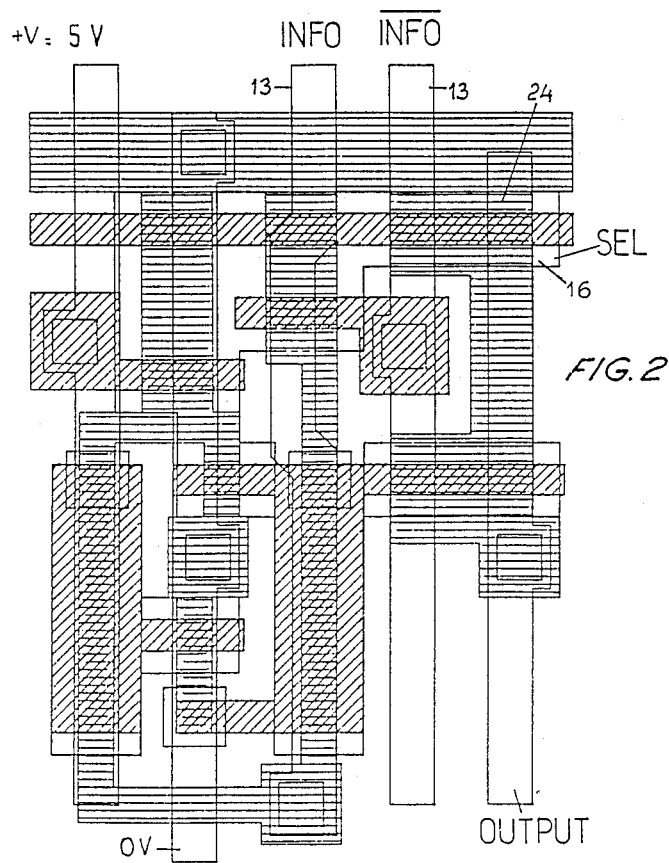
FIG. 2 shows a possible topology of the memory point of FIG. 1, in N-MOS technology.

The topology of the circuit of FIG. 1 may be that shown in FIG. 2, where the masks corresponding to the different doping and metallization levels are identified by different cross hatchings. In FIG. 2, the elements corresponding to those of FIG. 1 are shown by the same reference number for clarity.

To illustrate the high density level which may be achieved, it is sufficient to note that the grid width may be reduced to 3,15 μm and leads to space requirements for one memory cell of about 80×60 μm.

There will now be described implementation of a memory cell with preloading, typically as shown in FIGS. 1 and 2, in an integrated circuit for delivering, in response to an address X=k, x and in a single working cycle, the result of the operation:

$$Y = y(k)*(1-x) + y(k+1)*x$$

where
- k is the whole part of the address X,
- x is the fractional part of the address X,
- $y(k)$ and $y(k+1)$ are the respective contents at addresses k and k+1, in a memory belonging to the circuit, k+1 being taken modulo the number of words in the memory.
- k and x are coded over several bits, eight bits for example.

Each address has a content coded over several bits, sixteen for example.

The interated circuit (FIG. 3) may then be regarded as having three essential parts and their associated elements:
- a bus 26 physically located at the periphery of the circuit,
- a memory associated with a decoding system and with input circuits,
- an interpolation operator.

Bus

The bus 26 is in closed loop so as to facilitate interconnections, to improve the manufacturing efficiency and to limit the consequences of a conductor cut. To the bus are connected the pins of the circuit casing. In the case where the words stored in the memory have a length of sixteen bits, a conventional twenty-four pin package may be used by multiplexing, as will be mentioned later. Sixteen pins are assigned to the data inputs/outputs and identified X0/Y0, ... X15/Y15 in FIG. 3.

Since signals X and Y do not appear simultaneously they may transit through the same pins of the integrated circuit.

Figure 3:
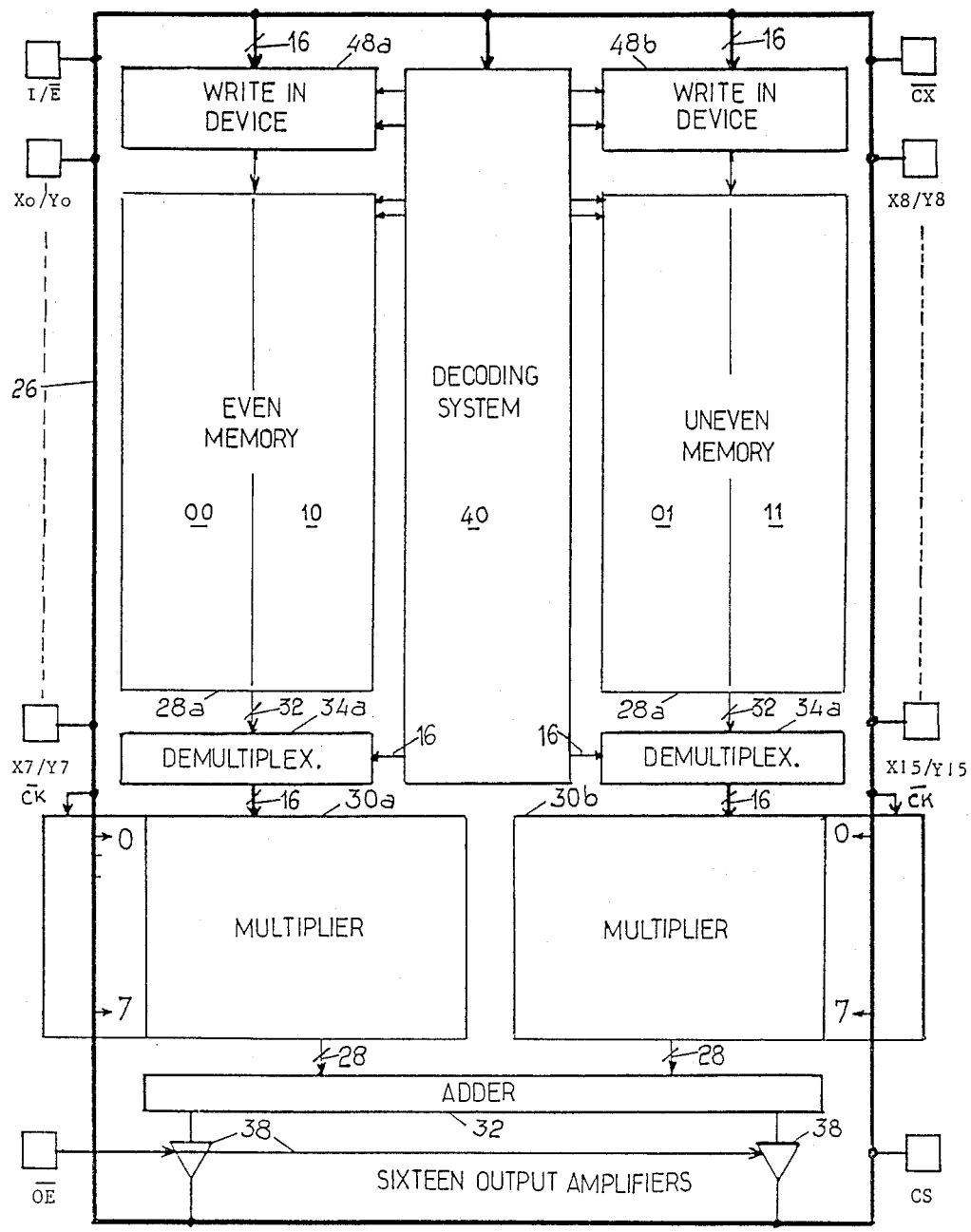
FIG. 3 is a block diagram of an integrated interpolation circuit in accordance with the invention.

The other pins are designated, in FIG. 3, by the following abbreviations:
- $\overline{CS}$: selection (chip select)
- $\overline{OE}$: validation of the outputs Y, for ensuring time multiplexing
- $\overline{CX}$: loading through the pins X/Y
- I/E: access for read-out with interpolation (when the input level is at 1) or for writing (when the input level is at 0).

Memory

The memory is formed from an even number of words (256 words of 16 bits for example) divided into two blocks 28a and 28b which will be called hereafter "even memory" and "uneven memory" and which contain respectively:
- the words of even address: k=0, 2, 4, ..., 254,
- and the words of uneven address: k=1, 3, ... 255.

Each block is itself divided into two imbricated sub-blocks, each formed (in the case of 256 words) of 64 words, forming 64 rows. The four sub-blocks are identified by the numbers 00 and 10 in the even memory 28a, 01 and 11 in the uneven memory 28b. These sub-blocks then contain addresses:
- k=0, 4, 8, ..., 252 for the sub-block 00,
- k=2, 6, 10, ..., 254 for the sub-block 10,
- k=1, 5, 9, ..., 253 for the sub-block 01,
- k=3, 7, 11, ..., 255 for the sub-block 11.

With such organisation a simple access for writing is obtained: the input of data of sixteen bits into an address k requires a writing operation with addressing limited to k. But read-out access may be readily made double, sending an address k causing read-out of the two data at consecutive addresses y(k) and y(k+1). Double access is made possible by the decoding system 40 which will now be described, in the particular case where the memory comprises two blocks 28a and 28b of 64 rows each having 32 memory cells (corresponding to two addresses k and k+2) and a common selection wire 16. Wire 16 is brought to the high level (SEL=1) for selecting the row for read-out.

Figure 4:
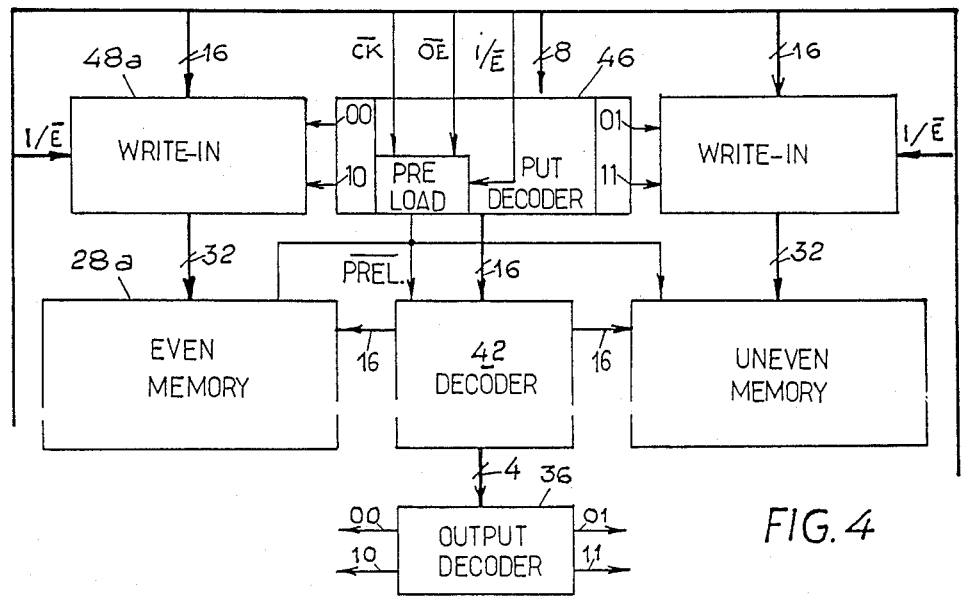
FIG. 4 shows a possible internal architecture of the decoding system of the circuit of FIG. 3.

The decoding system 40 (FIG. 4) may be regarded as formed of three sub-assemblies essentially having NOR gates for increasing the speed. These sub-assemblies are a row decoder 42, an output decoder (or demultiplexing decoder) 36 and an input decoder 46 which will be successively described.

The row decoder 42 controls the state of the selection wires and tests the two least significant bits. Due to linking between successive stages of decoder 42, the latter will behave as follows:

if the two LSBs received are different from 11 (i.e. designate a sub-block other than the last one of the row), the row decoder activates two selection wires of the same rank in the even memory 28a and uneven memory 28b;

if these two bits are ones, the row decoder activates a row of rank n (n being an integer) in the uneven memory 28b, the row of rank n+1 in the even memory 28a. The last stage of the decoder 42 is connected back to the first one so that address word n=255 is followed by address word n+1=0.

Figure 5:
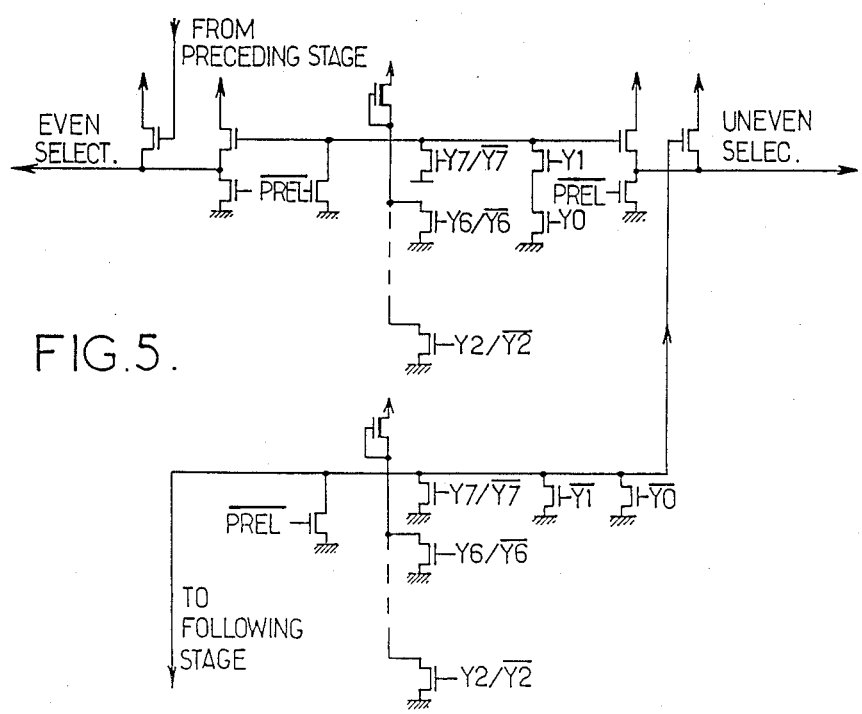
FIG. 5 is an electric diagram of a portion of the row decoder of the system of FIG. 4.

As shown in FIG. 5, each stage of the row decoder 42 comprises twenty-six MOS transistors mounted in a NOR gate configuration for attaining a cycle time not exceeding 20 ns and compatible with the read-out time of 20 ns which may be attained with the memory cell shown in FIGS. 1 and 2.

The output decoder 36 controls output demultiplexers 34a and 34b for selecting, at the output of the memory blocks, that one of the two words which is to be addressed to the interpolator. The output decoder 36 may have the same construction as decoder 42 but it comprises only two stages. It causes selection of that one of the two words of sixteen bits fed to the demultiplexer which corresponds, for one of the memories to the address k received, for the other memory to the address k+1.

Thus, depending on whether the received address is even or uneven, the word y(k) will be read out either from the even memory, or from the uneven memory, the word y(k+1) being read out from the other memory.

The input decoder 46 comes into play during a write operation into the memory.

It must select, from the four addresses (each corresponding to a sixteen bits word) activated by the line decoder, by forcing the selection wire to the high level, the address where the data presented on the wires INFO and $\overline{\text{INFO}}$ (column wires) will be stored. This decoder is preceded by a network of eight address storage flip-flops and enables the sixteen appropriate writing amplifiers among the 2×32 amplifiers included in the devices 48a and 48b for writing in blocks 28a and 28b.

The memory further comprises input circuits which control and store the input/output signals so that the data and the addresses acceed correctly to the memory. These circuits comprise writing amplifiers, temporary address storage flip-flops (latches), and a preloading device, intended for keeping the outputs 24 at the high level until read-out.

There are thirty-two writing amplifiers per memory block; they generate, from a data X0, . . . X15 applied to the I/O pins, a signal having the same logic level for each bit presented and a signal having the complementary logic level. They are controlled by the I/$\overline{\text{E}}$ service signal and an internal signal called "forcing signal".

If the I/$\overline{\text{E}}$ signal is at the low level, the writing operation is enabled. If high, it is disabled.

If the "forcing" signal is at the low level, the group of sixteen amplifiers corresponding to the address supplied is selected and a write operation is possible; when on the other hand the "forcing" signal is at the high level, the outputs of the writing amplifiers are forced to the low level, so as to prevent modification of the contents of the memory cells corresponding to the word addressed.

The temporary address storage flip-flops are intended to retain the eight bits designating the address x supplied to the circuit. These flip-flops also give the complemented values, so as to facilitate decoding.

The preloading device 47 is provided for supplying an active signal, at the high level, when the circuit as a whole is neither in reading phase nor in writing phase. It then presets all the memory output wires to 1. In the case of an enrichment or depletion N-MOS transistor, presetting decreases the cycle time, for the output wires of the memory preset to 1 pass much more readily to 0 than they would pass from 0 to 1.

INTERPOLATION OPERATOR

The interpolation operator must execute in parallel two multiplications of two sixteen bit words read out from the memory; one is multiplied by the word x formed of the eight LSBs of the address (fractional part of the address) and the other is multiplied by their complement to 1.

If the LSB of the whole part of the address is 0, a word output from the even memory is multiplied by x and the word output from the uneven memory by 1−x.

If, on the other hand, the latter bit is 1, the multipliers are (1−x) and x, respectively.

For that result, the interpolation operator comprises two identical multipliers 30a and 30b. Each multiplier executes the multiplication of sixteen bits by eight bits in a complement-to-2 code, with a result truncated to the eighteen most significant bits (MSBs), after correction for rounding off.

This operation may be effected by a Booth type multiplier which multiplies a number of sixteen bits by a number of eight bits coded as "complement-to-2". The number coded as "complement-to-2" over eight bits is transformed into five 3-bits bytes controlling the logic network of the multiplier. To speed up the carry over of the carries and of the partial sums in the multiplier, the penultimate row of adders is distributed into groups of seven bits and the carry over of the group of seven bits is calculated by an anticipated carry logic.

The multipliers are followed by a high speed parallel adder 32. This adder effects truncation and rounding off correction. Finally, the result, coded over sixteen bits in the present example, is applied to the bus through output amplifiers 38 controlled by the $\overline{\text{OE}}$ input. Data is thus available on the bus if OE is in its low level.

The operator receives the LSBs of the address, representing the fractional part of the address, from the peripheral bus (connections indicated as 0 to 7 in FIG. 3). The eight LSBs are stored by two groups each of eight flip-flops, upstream of the circuit supplying the multiplier either with this unchanged word x, or with the word 1−x, depending on the value of the LSB of the whole part k of the address.

The interpolator circuit which has just been described can be included in numerous apparatus, particularly a digital generator of periodic signals, typically of high quality audio frequency signals.

Such an apparatus will frequently comprise a microprocessor which defines the signals to be generated and stores the wave form in the memory of the interpolator circuit, as samples. In a second phase, the microprocessor acceeds to one or more previously stored wave forms by reading the interpolator memory and by linearly interpolating if the above-described circuit is used.

Figure 7:
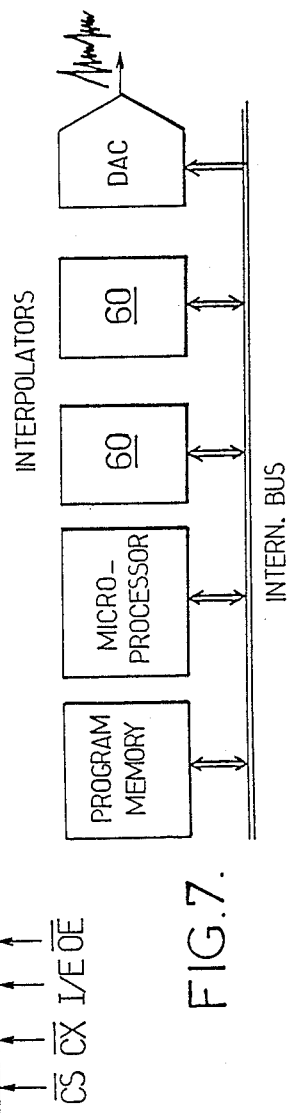
FIG. 7 is a functional diagram indicating how the interpolator circuit of the invention may be used in a musical signal synthesizer.

The apparatus may have the general configuration shown in the functional diagram of FIG. 7, using several interpolator circuits 60 of the kind illustrated in FIG. 3.

WRITE OPERATION

The write operation is caused by $\overline{\text{CS}}$=0. The address of the memory row where reading is to take place is applied to the inputs X0/X15 and it is stored in the circuit by CX. Only the eight MSBs X8–X15, representing the address k, are taken into account. A single access to the memory is concerned. The data D is applied to inputs Y0–Y15 about 300 ns afterwards and are taken into account on the appearance of I/$\overline{E}$=0.

To obtain an interpolation point, the value X of th corresponding abscissa is applied to the inputs X0–X15 and is stored upon command $\overline{CX}$. The stored value is split into two groups of eight bits:

the eight MSBs X8–X15, which form the stored address k of the sample upstream of the interpolation;

X0–X7, the fractional part x of X, for interpolation calculations.

The two memory addresses required are k and k+1. Since the circuit has a double access, it supplies directly two data words of sixteen bits y(k) and y(k+1). The double reading access is shown schematically in FIG. 6 as an adder 50. The two sixteen data words y(k) and y(k+1) are simultaneously entered into the computing circuit which is a combination circuit for greater speed.

Figure 6:
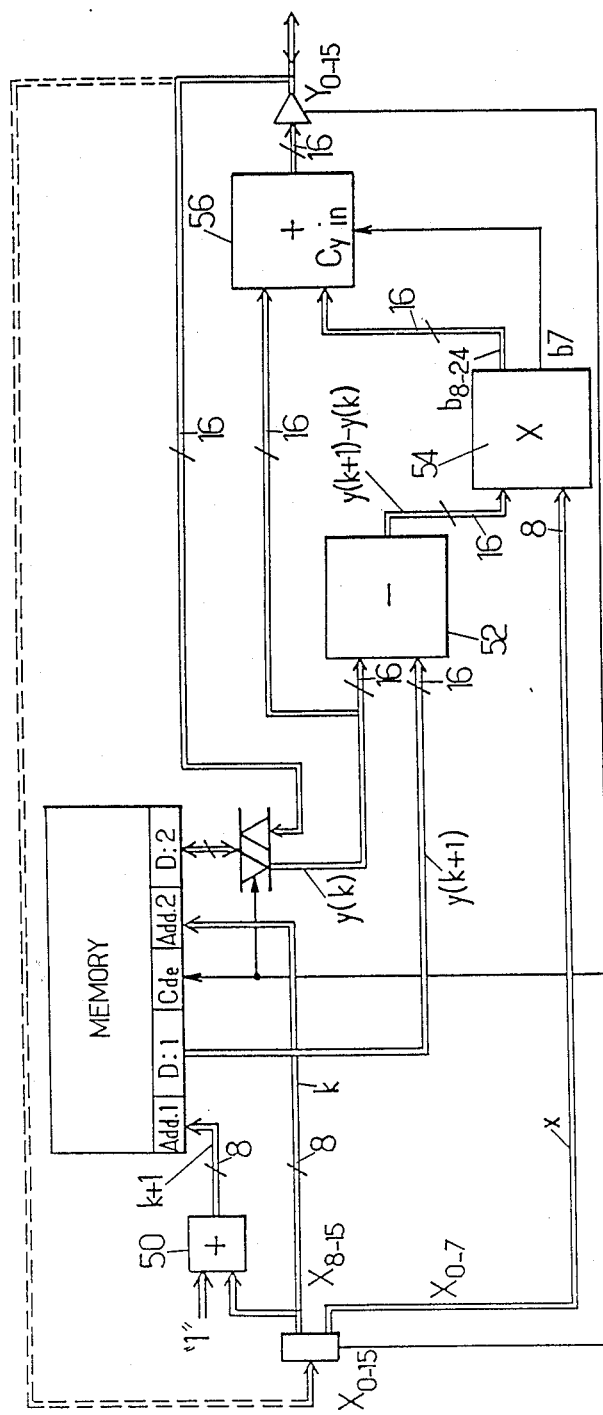
FIG. 6 is a functional diagram of an interpolator circuit in accordance with the invention.

As shown in FIG. 6, the circuit does not carry out algorithm (1) but the equivalent algorithm:

$$Y = y(k) + [y(k+1) - y(k)]^* x.$$

This algorithm leads to using, as computing circuit, a subtractor 52 working on sixteen bits, followed by a multiplier 54 for multiplying sixteen bits by eight bits and a rounding off adder 56. The result of the calculation may, whatever the type of calculating circuit, be delivered on outputs Y0–Y15 responsive to command $\overline{OE}$ which occurs a few tens of nanoseconds later.

We claim:

1. A fast read-write memory for integration on a semiconductor substrate, having a plurality of memory points wherein each memory point has
   a set-reset flip-flop having two metal-oxide-semiconductor storage transistors, whose drains are grounded and whose sources are connected to a voltage source through respective load transistors,
   a metal-oxide-semiconductor output transistor having a grid connected to the source of one of said storage transistors and having a source connected to a read-out output line,
   two input data lines arranged to receive complementary binary data each connected to the grid of a respective one of a pair of MOS switch transistors whose source is connected to the source of a respective one of said storage transistors,
   a pair of first control transistors each having a grounded drain and a source which is connected to the drain of a respective one of said switch transistors and a second control transistor having a grounded drain and a source which is connected to the drain of the output transistor,
   and a selection line connected to the grids of all said control transistors.

2. A fast memory according to claim 1, wherein said storage transistors, switch transistors and control transistors are N-MOS transistors.

3. A digital circuit integrated on a semi-conductor substrate comprising:
   a random access memory having an output and including a plurality of memory cells each having a set-reset flip-flop with complementary data inputs having either one of a first and a second predetermined input logic level, selection transistor means connected to said flip-flop and to a selection wire having either one of a first and a second predetermined selection level and arranged for forcing the flip-flop to that of said data inputs which is at said first predetermined input logic level when said selection wire is at said first predetermined selection level, and means for connecting said flip-flop to an output wire and arranged for
   maintaining said output wire at a higher one of said first and second logic levels as long as said selection wire is at said first predetermined selection level and for
   bringing said output wire to that one of said first and second predetermined input logic levels which corresponds to the condition of the flip-flop when said selection wire is brought to said second predetermined selection level;
   multiplier means connected to a common output of said memory
   and addressing means for delivering to said random access memory an address word having a whole part corresponding to an address in said random access memory and a fractional part which is applied to said multiplier means as a multiplicand for the content of the random access memory at said address.

4. The digital circuit as claimed in claim 3, wherein said random access memory is split into two blocks, one corresponding to even addresses and the other to odd addresses and wherein said random access memory is connected to a decoding system,
   said decoding system, from one single address (k, x), causing read-out of the data y(k) and y(k+1) respectively stored at addresses k and k+1, where k is the whole part of the address and x is the fractional part of the address, and
   controlling the multiplier for carrying out the operation:

$$y(k)^* x + y(k+1)^* (1-x).$$

5. An integrated digital linearly interpolating metal-oxide-semiconductor circuit, comprising:
   a random access memory split into two blocks, one corresponding to even addresses and the other to odd addresses, each of said blocks having a plurality of rows of memory cells each row for storage of a data word, each said cell having a flip-flop connected to means for preloading an output wire of said memory cell to that of two logic levels which can be taken by said cell from which commutation is faster responsive to change of the condition of a selection wire common to all memory cells of the row,
   a decoding system connected to said random access memory and which, from one complete single address (k, x) applied to said random access memory causes read-out of data words written at addresses k and k+1, where k is a whole part of the address,
   and multiplier means connected to an output of said random access memory for carrying out an interpolation between the two data values y(k) and y(k+1) stored at addresses k and k+1 for providing the value for a fraction x of the difference between (k) and (k+1).

6. The circuit as claimed in claim 5, wherein each of said memory blocks is divided into two imbricated sub-blocks, a same one of said selection wires being dedicated to corresponding rows in a same sub-block and wherein each of said sub-blocks has an output demultiplexer controlled by a decoding system for selecting the addressed value.

7. The circuit as claimed in claim 6, wherein said decoding system has a row decoder for activating the two selection wires which have a same order in the two memory blocks when the two less significant bits of an address received by said RAM on an address input indicate a sub-block other than a last sub-block of the row and two successive wires in the two blocks in the contrary situation.

8. The circuit as claimed in claim 5, integrated on a single semi-conductor substrate, further comprising a closed loop bus physically located at the periphery of said circuit around said RAM, decoding system and multiplier means.

* * * * *